(12) United States Patent
Morrison et al.

(10) Patent No.: US 7,157,951 B1
(45) Date of Patent: Jan. 2, 2007

(54) DIGITAL CLOCK MANAGER CAPACITIVE TRIM UNIT

(75) Inventors: Shawn K. Morrison, San Jose, CA (US); Raymond C. Pang, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/837,186

(22) Filed: Apr. 30, 2004

(51) Int. Cl.
*H03H 11/26* (2006.01)
(52) U.S. Cl. .................. 327/263; 327/276; 327/236
(58) Field of Classification Search ........ 327/261–262, 327/276–281, 263, 231, 236, 237
See application file for complete search history.

(56) References Cited

U.S. PATENT DOCUMENTS

| | | | |
|---|---|---|---|
| 5,068,628 A | 11/1991 | Ghoshal | |
| 5,283,631 A * | 2/1994 | Koerner et al. ............. | 326/121 |
| 5,465,076 A | 11/1995 | Yamauchi et al. | |
| 5,489,864 A | 2/1996 | Ashuri | |
| 5,644,262 A * | 7/1997 | Bazes ......................... | 327/277 |
| 5,646,564 A | 7/1997 | Erickson et al. | |
| 5,712,884 A | 1/1998 | Jeong | |
| 5,714,907 A * | 2/1998 | Bazes ......................... | 327/581 |
| 5,796,673 A | 8/1998 | Foss et al. | |
| 5,963,074 A | 10/1999 | Arkin | |
| 6,043,717 A | 3/2000 | Kurd | |
| 6,073,259 A * | 6/2000 | Sartschev et al. ........... | 714/724 |
| 6,104,223 A | 8/2000 | Chapman et al. | |
| 6,125,157 A | 9/2000 | Donnelly et al. | |
| 6,150,862 A * | 11/2000 | Vikinski ..................... | 327/262 |
| 6,151,356 A | 11/2000 | Spagnoletti et al. | |
| 6,184,753 B1 | 2/2001 | Ishimi et al. | |
| 6,194,930 B1 | 2/2001 | Matsuzaki et al. | |
| 6,289,068 B1 | 9/2001 | Hassoun et al. | |
| 6,292,040 B1 | 9/2001 | Iwamoto et al. | |
| 6,400,180 B1 | 6/2002 | Wittig et al. | |

(Continued)

FOREIGN PATENT DOCUMENTS

EP 0655840 A2 11/1994

(Continued)

OTHER PUBLICATIONS

Microelectronics Group, Lucent Technologies, Inc., Preliminary Data Sheet, May 1998, ORCA OR3Cxx (5 V), and OR3Txxx (3.3 V) Series Field-Programmable Gate Arrays, pp. 3, 69-80, available from Microelectronics Group, Lucent Technologies, Inc., 555 Union Boulevard, Room 30L-15P-BA, Allentown, PA 18103.

(Continued)

*Primary Examiner*—Dinh T. Le
(74) *Attorney, Agent, or Firm*—E. Eric Hoffman; John J. King; Justin Liu

(57) ABSTRACT

A delay line for a digital clock manager includes a tap delay structure and a trim delay structure. The trim delay structure includes a first buffer coupled to receive a clock signal from the tap delay structure, and in response, provide a delayed clock signal to a set of clock lines. The trim delay structure also includes a capacitive trim unit having a plurality of capacitive trim elements tapped off the set of clock lines. The capacitive trim elements are selectively enabled or disabled, thereby introducing additional delay to the delayed clock signal on the set of clock lines. Each capacitive trim element can include a transmission gate structure, which is turned on to introduce significant junction capacitance to the set of clock lines. The trim delay structure can also include a second buffer adapted to buffer the delayed clock signal on the set of clock lines.

26 Claims, 6 Drawing Sheets

U.S. PATENT DOCUMENTS

| | | | |
|---|---|---|---|
| 6,400,735 | B1 | 6/2002 | Percey |
| 6,501,309 | B1 | 12/2002 | Tomita |

FOREIGN PATENT DOCUMENTS

| | | |
|---|---|---|
| EP | 0704975 A1 | 4/1996 |
| JP | 5-191233 | 7/1993 |
| WO | WO97/40576 | 10/1997 |
| WO | WO99/14759 | 3/1999 |
| WO | WO 99/67882 | 12/1999 |

OTHER PUBLICATIONS

"Actel ES Family Digital Phase Lock Loop Usage", by Joel Landry, Sep. 17, 1996, pp. 1-5, available from Actel Corp., 955 East Arques Avenue, Sunnyvale, California 94086.

Xilinx, Inc.; "Virtex-II Pro Platform FPGA Handbook"; published Oct. 14, 2002; pp. 49-58 and 180-201, available from Xilinx, Inc., 2100 Logic Drive, San Jose, California 95124.

U.S. Appl. No. 10/792,055, filed Mar. 2, 2004, Lu.

U.S. Appl. No. 10/618,404, filed Jul. 11, 2003, Young.

U.S. Appl. No. 09/684,529, filed Oct. 6, 2000, Logue et al.

U.S. Appl. No. 09/684,540, filed Oct. 6, 2000, Young et al.

U.S. Appl. No. 10/837,210, filed Apr. 30, 2004, Percey et al.

U.S. Appl. No. 10/837,324, filed Apr. 30, 2004, Pang et al.

U.S. Appl. No. 10/837,059, filed Apr. 30, 2004, Logue et al.

U.S. Appl. No. 10/683,944, filed Oct. 1, 2003, Young.

\* cited by examiner

DIGITAL CLOCK MANAGER CAPACITIVE TRIM UNIT

FIELD OF THE INVENTION

The present invention relates to a trim delay unit for a digital clock manager. More specifically, the present invention relates to a capacitive trim delay unit.

RELATED ART

Synchronous digital systems, including board level systems and chip level systems, rely on one or more clock signals to synchronize elements across the system. Typically, one or more clock signals are distributed across the system on one or more clock lines. However, due to various problems such as clock buffer delays, high capacitance of heavily loaded clock lines, and propagation delays, the rising edges of a clock signal in different parts of the system may not be synchronized. The time difference between a rising (or falling) edge in one part of the system with the corresponding rising (or falling) edge in another part of the system is referred to as "clock skew".

Clock skew can cause digital systems to malfunction. For example, it is common for circuits in digital systems to have a first flip-flop output driving a second flip-flop input. With a synchronized clock on the clock input of both flip-flops, the data in the first flip-flop is successfully clocked into the second flip-flop. However, if the active edge on the second flip-flop is delayed by clock skew, the second flip-flop might not capture the data from the first flip-flop before the first flip-flop changes state. Clock skew relative to data signals can also cause similar problems. Delay lock loops are used in digital systems to minimize clock skew.

FIG. 1 is a block diagram of a portion of a conventional field programmable gate array (FPGA) 100, which includes digital clock manager (DCM) 101, global clock driver 102, clock routing network 103, output flip-flop 104, and input flip-flop 105. Digital clock manager 101 includes a conventional delay lock loop. Other well-known elements of FPGA 100 are not illustrated in FIG. 1 for purposes of clarity. An external reference clock signal CLK_IN is routed to DCM 101. In response to the CLK_IN signal, DCM 101 generates an output clock signal CLK_OUT, which is provided to global clock driver 102. The output clock signal CLK_OUT is transmitted through global clock driver 102 to clock routing network 103. Clock routing network 103 transmits the output clock signal CLK_OUT throughout FPGA 100 with minimum skew within the FPGA, but with a significant delay. A plurality of distributed clock signals, all exhibiting a similar delay, are provided at ends of clock routing network 103. One of these distributed clock signals is illustrated as the distributed clock signal, DIST_CLK. The DIST_CLK signal is used to clock data values within FPGA 100. For example, the DIST_CLK signal is used to clock the data value $D_1$ into output flip-flop 104, thereby providing an output data value $D_{OUT}$, which is synchronous with the DIST_CLK signal. Similarly, the DIST_CLK signal is used to clock the data value $D_{IN}$ into input flip-flop 105, thereby providing an input data value $Q_1$, which is synchronous with the DIST_CLK signal.

The DIST_CLK signal is also provided to a feedback terminal of DCM 101. In response to the DIST_CLK signal, DCM 101 adjusts phase by introducing a delay in the output clock signal CLK_OUT. DCM 101 controls the amount of delay introduced, such that the active edges of the distributed clock signal DIST_CLK have a predetermined phase relationship (e.g., a fixed, known offset) with respect to the active edges of the input clock signal CLK_IN. This phase relationship is selected to minimize the required signal hold time associated with input flip flop 105, and minimize the clock-to-output delay associated with output flip flop 104.

In one example, the introduced delay causes the internally distributed clock signal DIST_CLK to be synchronized with the external clock signal CLK_IN.

FIG. 2 is a block diagram of a conventional DCM 101, which includes delay lines 201–205, controller 210, phase detectors 211–212 and output generator 220. Phase detector 211 is coupled to receive the CLK_IN and DIST_CLK signals. In response, phase detector 211 provides a control signal representative of the phase difference between these two signals to controller 210. In response to this control signal, controller 210 provides a tap/trim select signal to delay line 201. Delay line 201 includes a plurality of taps and trim delay units. Delay line 201 introduces or removes delay (taps or trim delay units) to the path of the CLK_IN signal in response to the tap/trim select signal. In response, delay line 201 provides a first delayed clock signal CLK0 to both output generator 220 and delay line 202. One example of delay line is described in U.S. Pat. No. 6,400,735, entitled "Glitchless Delay Line Using Gray Code Multiplexer".

Delay line 202 introduces a delay to the CLK0 signal, thereby providing a delayed clock signal CLK90, which is provided to both output generator 220 and delay line 203. Delay line 203 introduces a delay to the CLK90 signal, thereby providing a delayed clock signal CLK180, which is provided to both output generator 220 and delay line 204. Delay line 204 introduces a delay to the CLK180 signal, thereby providing a delayed clock signal CLK270, which is provided to both output generator 220 and delay line 205. Delay line 205 introduces a delay to the CLK270 signal, thereby providing a delayed clock signal CLK360, which is provided to both output generator 220 and phase detector 212. Phase detector 212 also receives the CLK0 signal. In response, phase detector 212 provides a control signal representative of the phase difference between these two signals to controller 210. In response to this control signal, controller 210 provides tap and trim select signals to delay lines 202–205, such that the CLK0 and CLK360 signals are synchronized. Each of delay lines 202–205 introduces the same delay, such that the CLK90, CLK180 and CLK270 signals lag the CLK0 signal by 90°, 180° and 270°, respectively. Output generator 220 can provide multiple, different clock signals in response to the phases created by the delay lines 202–205, including the CLK0, CLK90, CLK180 and CLK 270 clock signals and clock signals having different frequencies than the CLK0 signal. One of these output clock signals is illustrated as the CLK_OUT signal.

FIG. 3 is a block diagram of conventional delay line 202. Delay lines 203–205 are substantially identical to delay line 202. Delay line 202 includes tap delay 301 and trim delay unit 302. Tap delay 301 includes a plurality of series-connected tap delay units and a multiplexer coupled to receive the output signal provided by each of the tap delay units. The multiplexer routes an output signal provided by one of the tap delay units in response to the tap select signal, TAP SEL. The tap delay 301 typically introduces a relatively large range of signal delay (e.g., on the order of 0 to 12.8 nanoseconds, if tap delay 301 includes 128 tap delay units, each with an associated delay of 100 picoseconds). Trim delay unit 302 adds smaller units of delay (e.g., on the order of 20 to 40 picoseconds each) for fine tuning the total delay.

Trim delay unit 302 is typically created by a fixed number of different circuit paths (e.g., eight paths), each including a circuit that provides a fixed delay. Each one of these circuit paths exhibits a slightly larger delay, such that the total delay is increased slightly by choosing a different circuit path. Each circuit path typically includes one or more inverters, or some other delay element, which is used to provide the desired delay.

As illustrated in FIG. 3, trim delay unit 302 includes eight trim delay elements TD0–TD7, which are connected in parallel as illustrated, and 8:1 multiplexer 303. Each of the eight trim elements TD0–TD7 has a slightly different associated delay. The CLK0 signal is applied to tap delay element 301, which provides a delayed clock signal to trim delay elements TD0–TD7. In response, trim delay elements TD0–TD7 provide corresponding delayed clock signals to multiplexer 303. A trim select signal (TRIM SEL) causes multiplexer 303 to route one of the delayed clock signals provided by trim delay elements TD0–TD7 as the CLK90 signal.

It would be desirable to reduce the number of paths in the trim delay unit, thereby reducing the required number of logic gates in the design of the DCM and reducing (or eliminating) the delay associated with multiplexer 303

In addition, the delays introduced by the circuit paths of the trim delay unit vary over process and temperature in a different manner than the tap delay elements. More specifically, because each of trim delay elements TD0–TD7 must be different, the sizing of these trim delay elements is necessarily different than the sizing of the delay elements in tap delay 301. This size difference causes the trim delay elements and tap delay elements to vary differently over process and temperature. It would therefore be desirable to have a trim delay unit that will vary over process and temperature in the same manner as the tap delay elements.

It would also be desirable to have a smaller trim step delay, thereby increasing the accuracy of the DCM and lowering the jitter of the entire DCM.

SUMMARY

Accordingly, the present invention provides a capacitive trim delay structure. A capacitive trim delay structure may be used in a DCM. The capacitive trim delay structure includes a single circuit path for the associated clock signal.

In one embodiment, the capacitive trim delay structure separates a tap delay into eight steps of delay. The tap delay is a fixed delay through one element of the delay line. The trim delay structure provides ⅛ fraction of a tap delay, to provide high de-skew accuracy. The invention uses capacitors to generate the trim steps.

In one embodiment of the present invention, a trim delay structure includes a first buffer and a capacitive trim delay unit. The first buffer is coupled to receive a clock signal from a tap delay structure, and in response, provide a first delayed clock signal to one or more clock lines. In some embodiments, one or more of the clock signals may be differential clock signals.

The capacitive trim unit, which includes a plurality of capacitive trim elements, is tapped off of the clock lines. The capacitive trim elements are selectively enabled or disabled, thereby introducing a second delay to the first delayed clock signal on the clock lines, and creating a second delayed clock signal. In accordance with one embodiment, each capacitive trim element includes a transmission gate structure, which is turned on to introduce significant junction capacitance to the differential clock lines. The transmission gate structure includes an n-channel transistor having a drain coupled to one of the clock lines, and a p-channel transistor having a drain coupled to the same clock line. The sources of the n-channel and p-channel transistors are commonly connected. The sources of the n-channel and p-channel transistors have relatively large layout areas (compared with a minimum process width). As a result of these large source regions, a significant junction capacitance is coupled to the clock lines when the n-channel and p-channel transistors are turned on.

The trim delay structure may include a second buffer coupled to receive the second delayed clock signal from the differential clock lines, and in response, provide a delayed output clock signal.

The trim delay structure can also include a load buffer coupled to the clock lines. The load buffer acts as a load on the first buffer in order for the first delay to closely match one tap delay in an associated tap delay structure.

The present invention will be more fully understood in view of the following description and drawings.

DETAILED DESCRIPTION

In general, aspects of the present invention provide a capacitive trim delay structure that is capable of introducing a plurality of trim delay steps along a single clock path.

Figure 1:
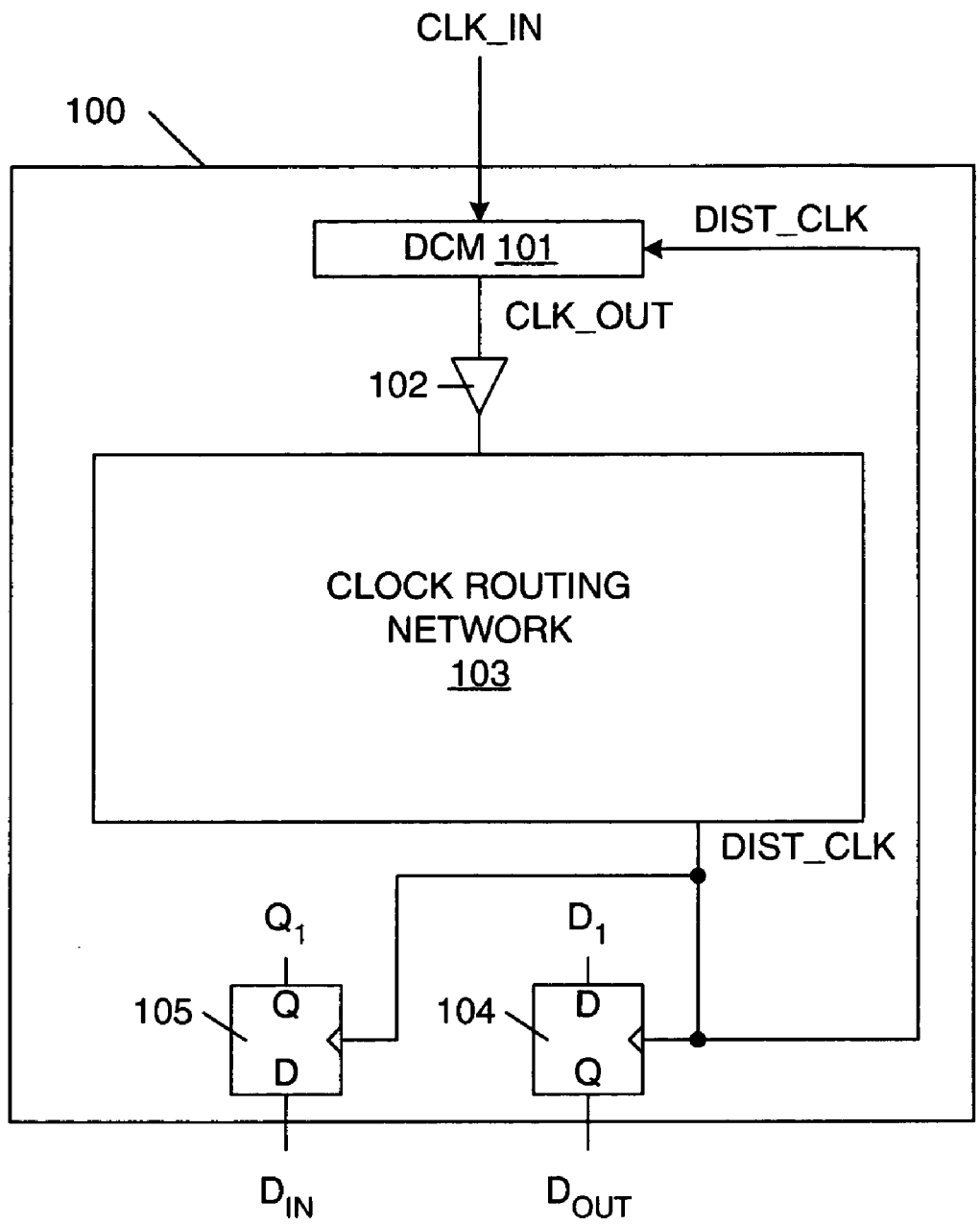
FIG. 1 is a block diagram of a portion of a conventional field programmable gate array (FPGA).
Figure 2:
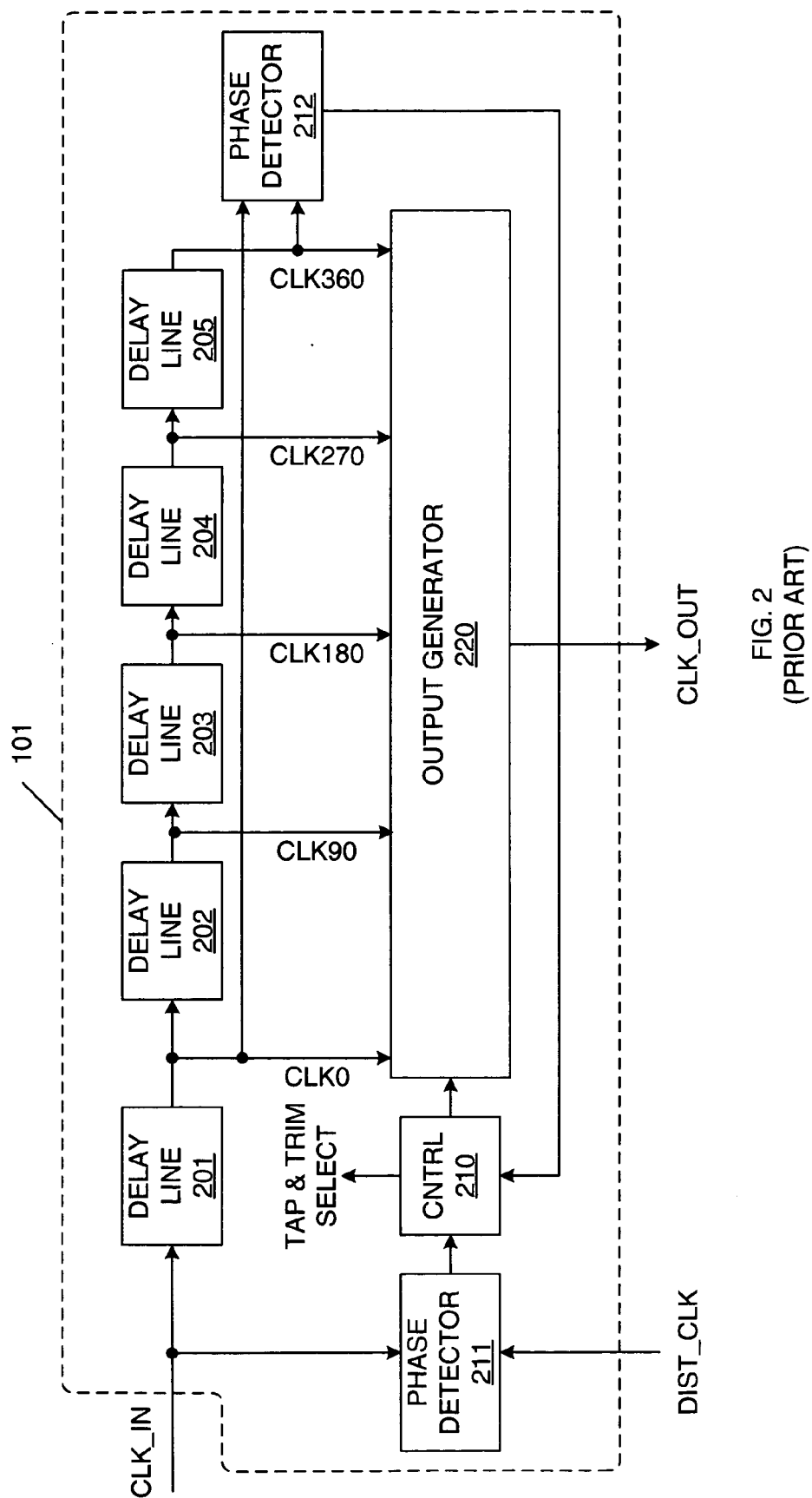
FIG. 2 is a block diagram of a conventional digital clock manager (DCM), which is included in the FPGA of FIG. 1.
Figure 3:
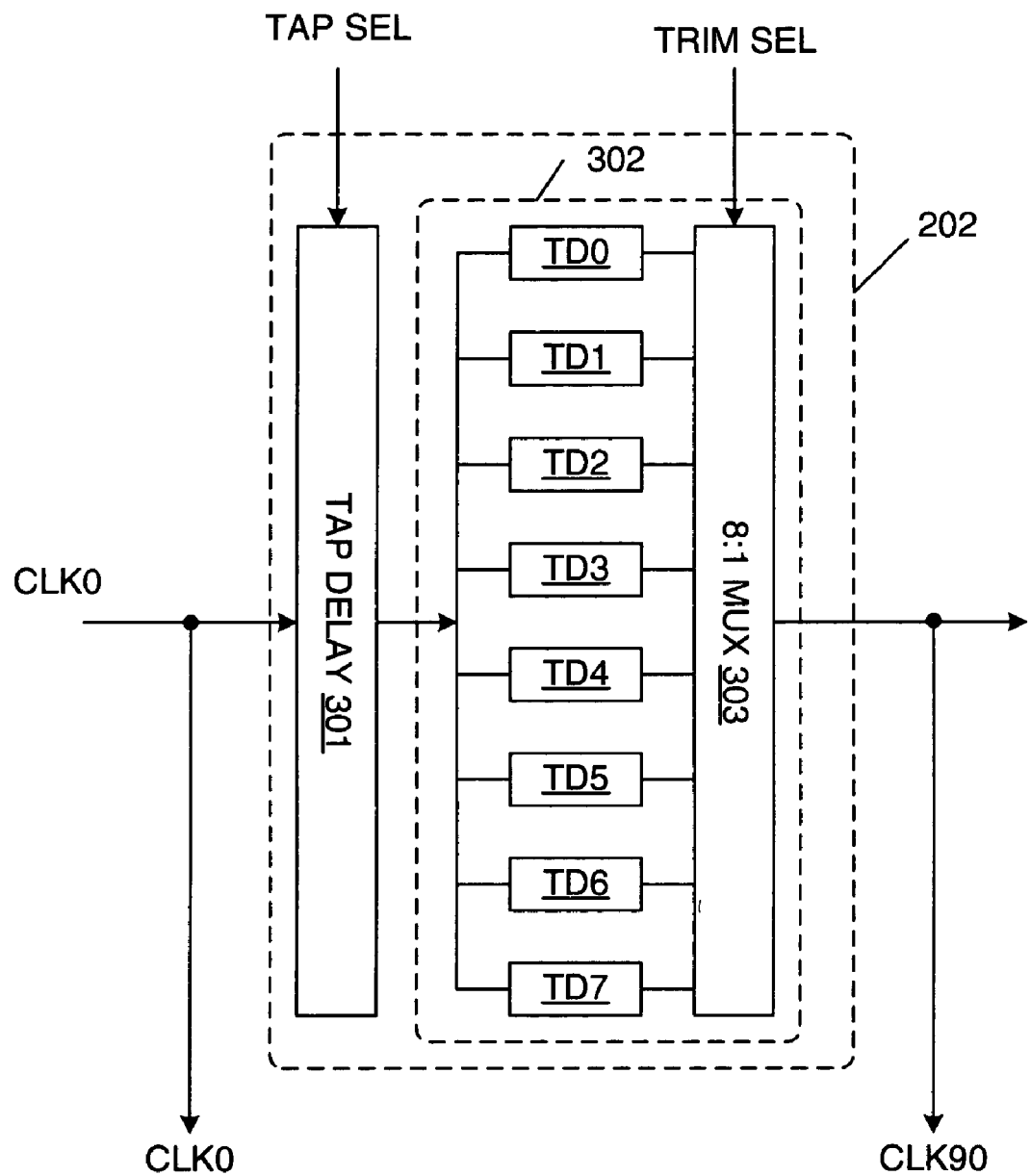
FIG. 3 is a block diagram of a conventional delay line, which is included in the DCM of FIG. 2.

The present invention may be used in many types of circuits where a trim delay unit is desirable, such as an FPGA similar to FPGA 100 of FIG. 1. An alternative embodiment of an FPGA may be found in U.S. patent application Ser. No. 10/683,944, entitled "Columnar Architecture" by Steven P. Young, which is incorporated herein in its entirety. An alternative embodiment of DCM 101 is described in U.S. patent application Ser. No. 10/792,055, entitled "Digital High Speed Programmable Delayed Locked Loop" by Wei Guang Lu, which is incorporated herein in its entirety.

Figure 4:
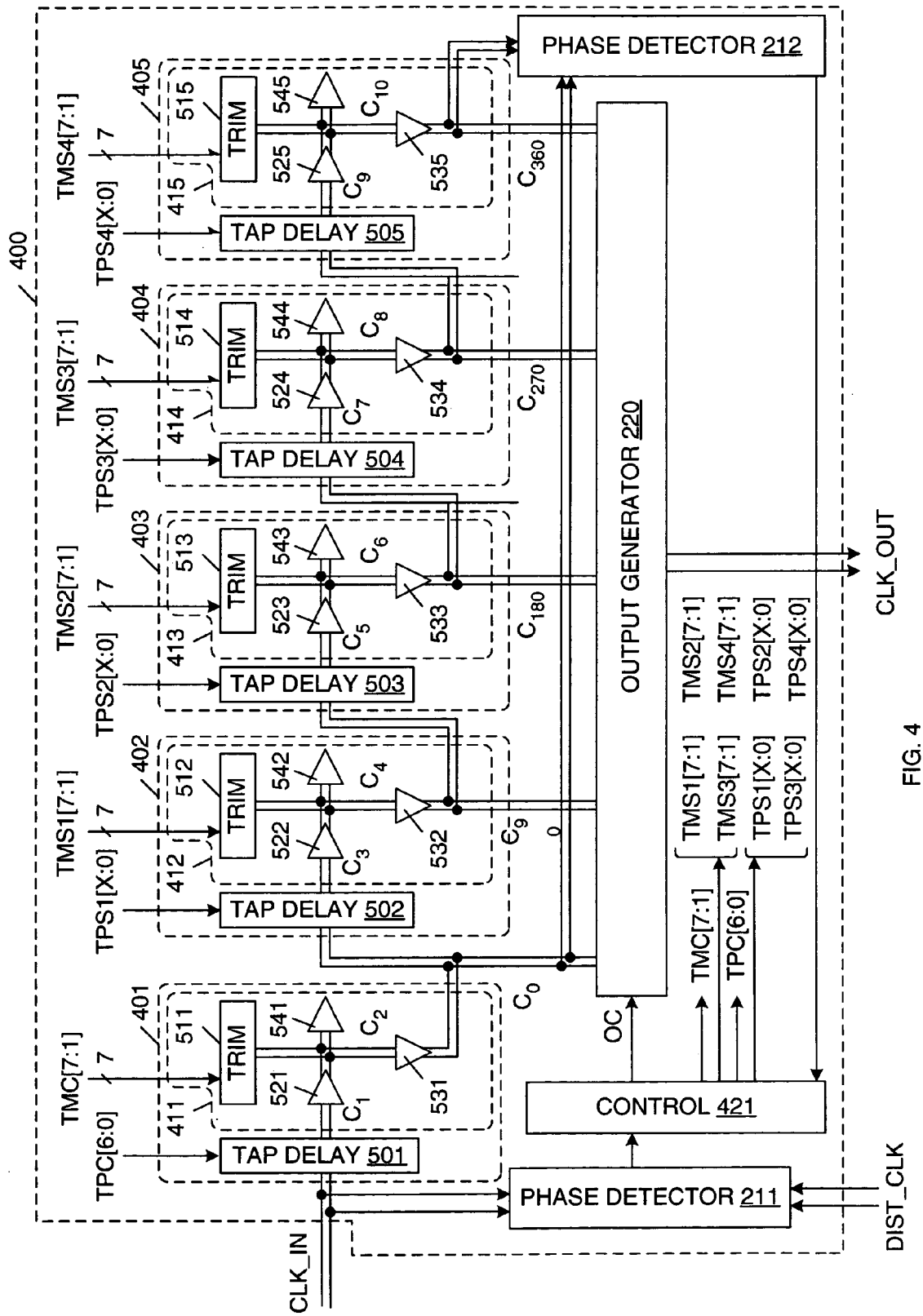
FIG. 4 is a block diagram of a DCM in accordance with one embodiment of the present invention.

FIG. 4 is a block diagram of a DCM 400 in accordance with one embodiment of the present invention. Because portions of DCM 400 (FIG. 4) are similar to portions of DCM 101 (FIGS. 1–3), similar elements in FIGS. 1–4 are labeled with similar reference numbers. Thus, DCM 400 includes phase detectors 211–212 and output generator 220, which have been described above. In accordance with the present invention, DCM 400 also includes delay lines 401–405 and control circuit 421. Although only five delay lines 401–405 are described in the present embodiment, it is understood that other numbers of delay lines can be used in other embodiments. Note that in the described embodiments, each of the clock signals CLK_IN, DIST_CLK and CLK_OUT is a differential clock signal, which is provided on a pair of clock lines. In other embodiments, the differential clock lines/signals can be replaced with single-ended clock lines/signals.

Each of delay lines 401–405 includes a tap delay structure 501–505, respectively, and a capacitive trim delay structures 411–415, respectively. Each of tap delay structures 501–505 has a conventional design. For example, each of tap delay structures 501–505 may include a plurality of tap delay elements, which are connected in series. The output terminal of each tap delay element is coupled to a multiplexer. A tap control signal causes the multiplexer to route a signal provided by one of the tap delay elements (or an input clock signal) to the output of the tap delay structure.

For example, tap delay structure 501 may include a chain of 127 series-connected tap delay elements. The CLK_IN signal is applied to this chain of tap delay elements. The CLK_IN signal and the output terminals of the 127 series-connected tap delay elements are coupled to input terminals of a 128-to-1 multiplexer. A tap control signal TPC[6:0] causes the multiplexer to route the CLK_IN signal or an output signal provided by one of the 127 series-connected tap delay elements to the output of tap delay structure 501 as clock signal $C_1$. Tap delay structure 501 can have other numbers of tap delay elements in other embodiments. Tap delay structures 502–505 are similar to tap delay structure 501. However, tap delay structures 501–505 may each have different numbers of delay elements. In the example shown, tap delay structures 502–505 are controlled by tap select signals TPS1[x:0], TPS2[x:0], TPS3[x:0] and TPS4[x:0], respectively.

Each of trim delay structures 411–415 includes a capacitive trim unit 511–515, respectively, a first tap buffer 521–525, respectively, a second tap buffer 531–535, respectively, and a load buffer 541–545, respectively.

Tap delay structures 501–505 provided clock signals $C_1$, $C_3$, $C_5$, $C_7$ and $C_9$, respectively, to first tap buffers 521, 522, 523, 524 and 525, respectively. In response, first tap buffers 521, 522, 523, 524 and 525 provide clock signals $C_2$, $C_4$, $C_6$, $C_8$ and $C_{10}$, respectively, to second tap buffers 531, 532, 533, 534 and 535, respectively. In response, second tap buffers 531, 532, 533, 534 and 535 provide clock signals $C_0$, $C_{90}$, $C_{180}$, $C_{270}$ and $C_{360}$, respectively, to output generator 220. The clock signals $C_0$, $C_{90}$, $C_{180}$ and $C_{270}$ are also provided to input terminals of tap delay structures 502, 503, 504 and 505, respectively. Phase detector 212 receives the $C_0$ and $C_{360}$, clock signals, and in response, provides a feedback signal to control circuit 421 representative of the phase difference between these two signals.

Load buffers 541–545 are coupled to first buffers 521–525, respectively, thereby providing matching loads for the clock signals $C_2$, $C_4$, $C_6$, $C_8$ and $C_{10}$, respectively. Capacitive trim units 511–515 are tapped off the lines that carry the clock signals $C_2$, $C_4$, $C_6$, $C_8$ and $C_{10}$, respectively. As described in more detail below, capacitive trim units 511–515 introduce trim delay to the clock signals $C_2$, $C_4$, $C_6$, $C_8$ and $C_{10}$, respectively, while only requiring a single path for these clock signals.

In general, DCM 400 operates as follows. The input clock signal CLK_IN and the distributed clock signal DIST_CLK are provided to phase detector 211. In response, phase detector 211 provides a feedback signal to control circuit 421 that is representative of the phase difference between the CLK_IN and DIST_CLK signals. In response to the feedback signal, control circuit 421 provides control signals such as a tap control signal TPC[6:0] to tap delay structure 501, and a trim control signal TMC[7:1] to trim delay structure 411, thereby selecting the delay of delay line 401. The tap control signal TPC[6:0] and trim control signal TMC[7:1] are selected such that the input clock signal CLK_IN has a desired phase relationship (e.g., is synchronized) with respect to the distributed clock signal DIST_CLK.

The $C_0$ clock signal and the $C_{360}$ clock signal are provided to phase detector 212. In response, phase detector 211 provides a feedback signal to control circuit 421 that is representative of the phase difference between the $C_0$ and $C_{360}$ signals. In response to the feedback signal, control circuit 421 provides tap select signals TPS1[X:0], TPS2[x:0], TPS3[x:0] and TPS4[x:0] to tap delay structures 502–505, respectively, and trim select signals TMS1[7:1], TMS2[7:1], TMS3[7:1] and TMS4[7:1] to trim delay structures 412–415, respectively, thereby selecting the delay of delay lines 402–405. The tap select signals TPS1[X:0], TPS2[X:0], TPS3[X:0] and TPS4[X:0] and trim select signals TMS1[7:1], TMS2[7:1], TMS3[7:1] and TMS4[7:1] are independently selected such that the $C_0$ and $C_{360}$ clock signals have a desired phase relationship (e.g., are synchronized). Each of delay lines 402–405 may introduce the same delay, such that the $C_{90}$, $C_{180}$ and $C_{270}$ signals lag the $C_0$ signal by 90°, 180° and 270°, respectively. Although the present invention uses four delay lines 402–405 to divide the period of the $C_0$ signal into four phases, it is understood that other numbers of delay lines can be used in other embodiments, to divide the period of the $C_0$ signal into other numbers of phases.

Control circuit 421 provides a multi-bit output control signal OC which causes output generator 220 to provide one or more different output clock signals in response to the $C_0$, $C_{90}$, $C_{180}$, $C_{270}$ and $C_{360}$ signals. The CLK_OUT signal is illustrated as an example of one of these output clock signals.

Capacitive trim structure 402 will now be described in more detail. In the described embodiments, capacitive trim structures 401–405 are substantially identical.

Figure 5:
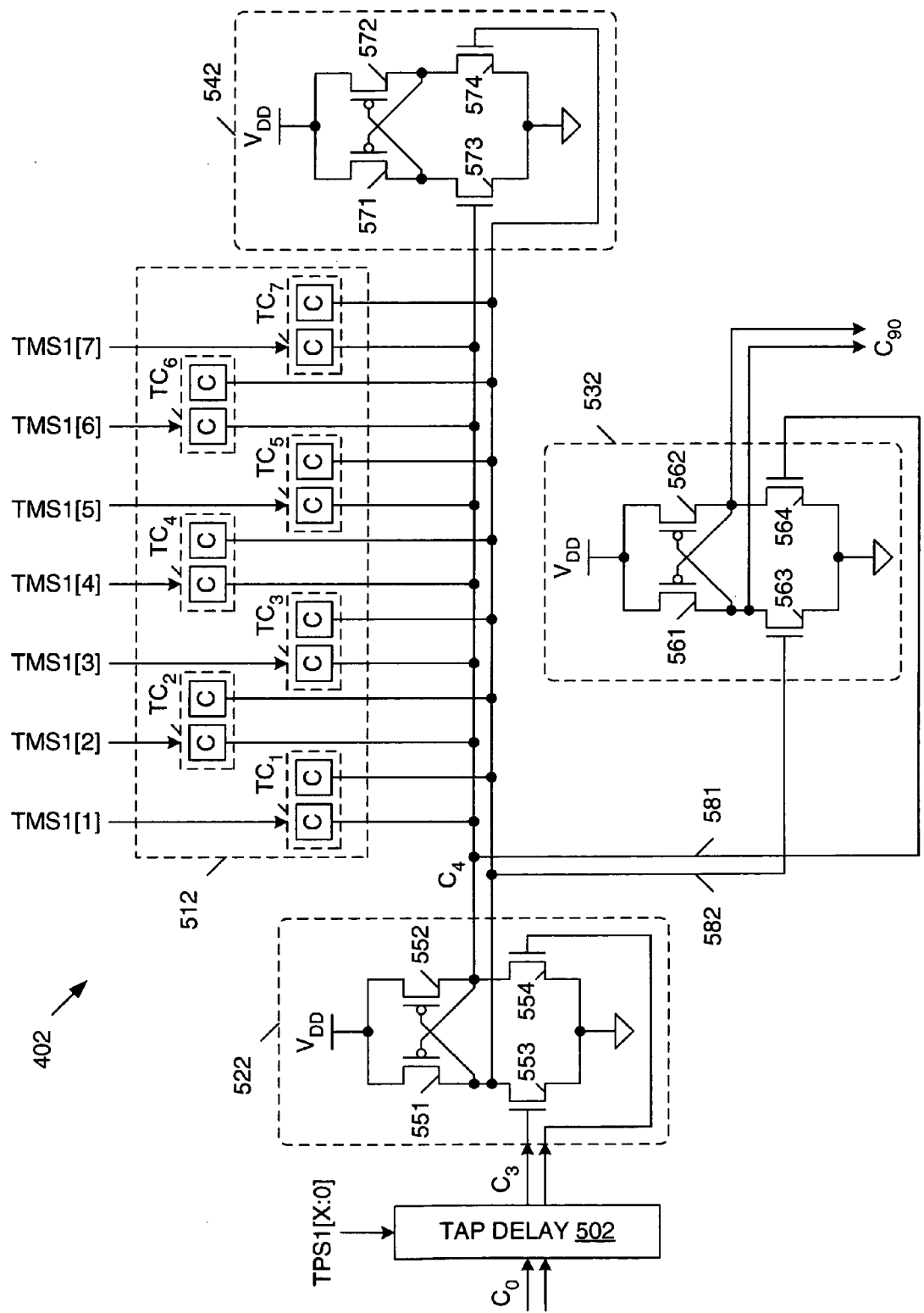
FIG. 5 is a circuit diagram of a delay line, including a capacitive trim delay structure in accordance with one embodiment of the present invention.

FIG. 5 is a circuit diagram of delay line 402 in accordance with one embodiment of the present invention. As described above, tap delay structure 502 provides the $C_3$ clock signal to first tap buffer 522. In the described embodiment, first tap buffer 522 is identical to each of the tap delay elements in tap delay structure 502, although this is not necessary. Tap buffer 522 includes p-channel transistors 551–552 and n-channel transistors 553–554, which are coupled as a differential buffer circuit, known as a differential cascode voltage switch logic (DCVSL) buffer. More specifically, the sources of p-channel transistors 551 and 552 are coupled to the VDD supply voltage terminal, the gate of p-channel transistor 551 is coupled to the drain of p-channel transistor 552, and the gate of p-channel transistor 552 is coupled to the drain of p-channel transistor 551. The sources of n-channel transistors 553 and 554 are coupled to the ground voltage supply terminal, the gates of n-channel transistors 553 and 554 are coupled to receive the differential clock signal $C_3$, and the drains of n-channel transistors 553 and 554 are coupled to the drains of p-channel transistors 551 and 552, respectively. The drains of p-channel transistors 551 and 552 are coupled to differential clock lines 582 and 581, respectively. Tap buffer 522 introduces a first tap delay to the differential clock signal $C_3$, such that the delayed differential clock signal $C_4$ is provided on differential clock lines 581–582.

Trim delay unit 512 includes seven capacitive trim elements $TC_1$–$TC_7$, which are tapped off of the differential clock lines 581–582. Each of capacitive trim elements $TC_1$–$TC_7$ includes a pair of capacitive elements, wherein each capacitive element is identified as a square containing a capital "C". Each of capacitive trim elements $TC_1$–$TC_7$ is coupled to receive a corresponding trim select signal TMS1[1]-TMS1[7], respectively. As described in more detail below, the trim select signals TMS1[1:7] control the capacitance coupled to differential clock lines 581–582, thereby controlling the delay of the differential clock signal $C_4$.

Tap buffer 532 includes p-channel transistors 561–562 and n-channel transistors 564 and 563, which are coupled in the same manner as p-channel transistors 551–552 and n-channel transistors 553–554 to form a differential buffer circuit, also DCVSL. The differential clock lines 581–582 (i.e., differential clock signal $C_4$) are coupled to the gates of n-channel transistors 563–564, respectively. Tap buffer 532, which provides simple output signal buffering, introduces a tap delay to the differential clock signal $C_4$, thereby creating the delayed differential clock signal $C_{90}$. Thus, the total delay introduced to the $C_0$ signal to create the delayed clock signal $C_{90}$ is equal to the sum of the tap delay introduced by tap delay structure 502, the tap delay introduced by tap buffer 522, the trim delay introduced by trim delay unit 512, and the tap delay introduced by tap buffer 532.

Differential clock lines 581–582 are also coupled to load buffer 542. Load buffer 542 includes p-channel transistors 571–572 and n-channel transistors 573–574, which are coupled in the same manner as p-channel transistors 551–552 and n-channel transistors 553–554 to form a differential buffer circuit (DCVSL). The differential clock lines 581–582 (i.e., differential clock signal $C_4$) are coupled to the gates of n-channel transistors 573–574, respectively. Load buffer 542 is identical to tap buffer 522, thereby providing a matching load on differential clock lines 581–582. Load buffer 542 acts as a load on tap buffer 522 in order to closely match one tap delay in tap delay structure 502. This matching load facilitates the connection of capacitive trim elements $TC_1$–$TC_7$.

Figure 6:
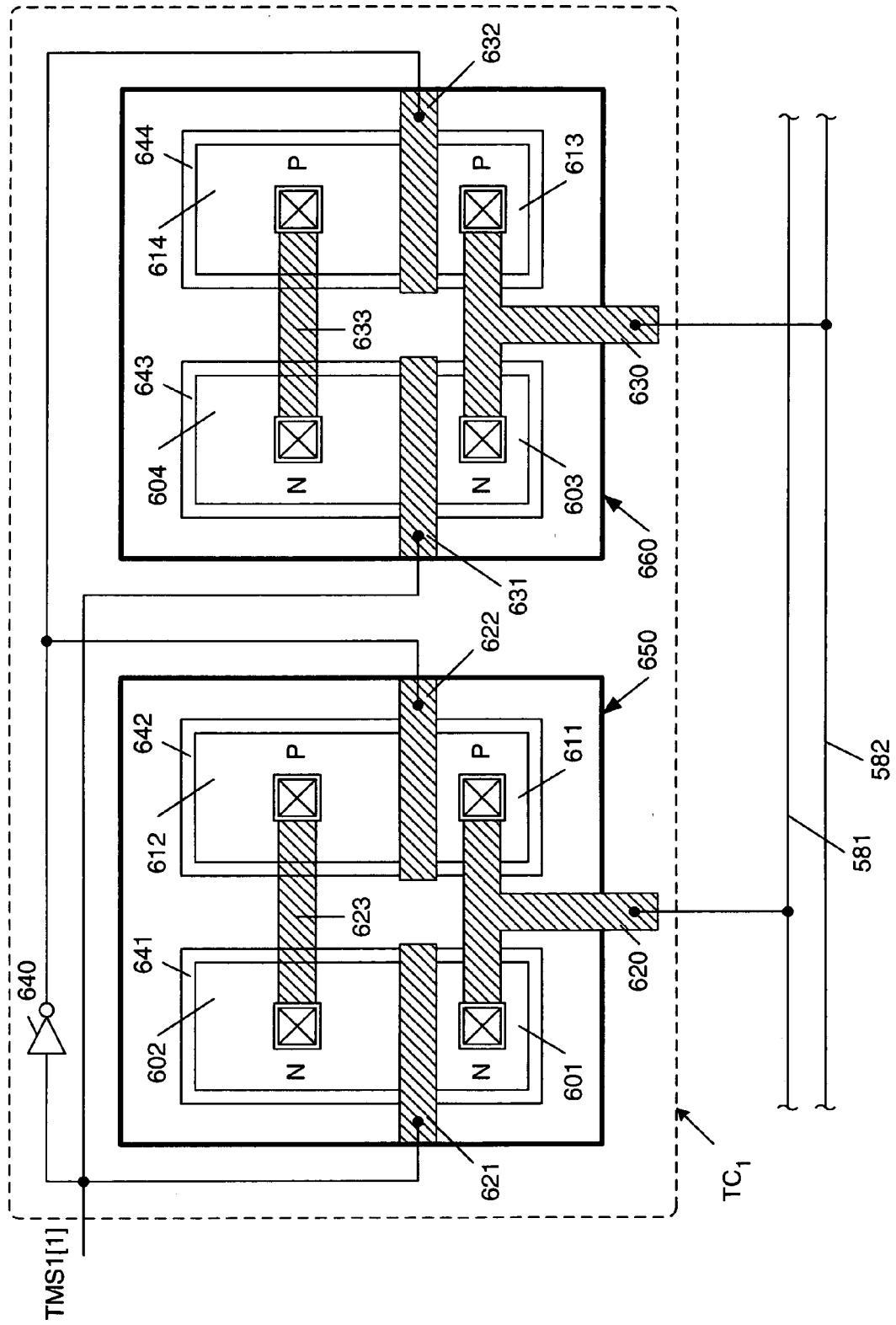
FIG. 6 is a layout and circuit diagram illustrating a capacitive trim element in accordance with one embodiment of the present invention.

FIG. 6 is a layout and circuit diagram illustrating capacitive trim element $TC_1$ in accordance with one embodiment of the present invention. Capacitive trim element $TC_1$ includes a pair of identical capacitive transmission gate structures 650 and 660.

Capacitive transmission gate structure 650 includes an n-channel field effect transistor and a p-channel field effect transistor. The n-channel transistor includes gate electrode 621, n-type drain region 601, n-type source region 602, and a p-type channel region (not shown) located beneath gate electrode 621 and between drain region 601 and source region 602. Drain region 601 and source region 602 are laterally isolated by field dielectric region 641.

The p-channel transistor includes gate electrode 622, p-type drain region 611, p-type source region 612, and an n-type channel region (not shown) located beneath gate electrode 622 and between drain region 611 and source region 612. Drain region 611 and source region 612 are laterally isolated by field dielectric region 642.

N-type drain region 601 and p-type drain region 611 are commonly connected to differential clock signal line 581 by electrically conductive element 620. N-type source region 602 and p-type source region 612 are commonly connected by electrically conductive element 623. The source regions 602 and 612 have a significantly larger area than the drain regions 601 and 611. In accordance with one embodiment, drain regions 601 and 611 are formed using the minimum process width. For example, in a 0.25 micron CMOS logic process, drain regions 601 and 611 may have a width of 0.25 microns. In contrast, source regions 602 and 612 are formed using a width greater than the minimum process width. For example, in a 0.25 micron process, source regions 602 and 612 may have widths of about 0.50 microns. The relatively large areas of source regions 602 and 612 result in a relatively large junction capacitance of the transmission gate structure 650, when this structure 650 is turned on. Although source regions 602 and 612 are larger than drain regions 601 and 611 in the described embodiment, in other embodiments, drain regions 601 and 611 may have different sizes, and for example may be the same size as source regions 602 and 612.

Capacitive transmission gate structure 660 includes an n-channel field effect transistor having gate electrode 631, n-type drain region 603, n-type source region 604, and a p-type channel region (not shown) located beneath gate electrode 631 and between drain region 603 and source region 604. Drain region 603 and source region 604 are laterally isolated by field dielectric region 643. The p-channel transistor includes gate electrode 632, p-type drain region 613, p-type source region 614, and an n-type channel region (not shown) located beneath gate electrode 632 and between drain region 613 and source region 614. Drain region 613 and source region 614 are laterally isolated by field dielectric region 644. N-type drain region 603 and p-type drain region 613 are commonly connected to differential clock signal line 582 by electrically conductive element 630. N-type source region 604 and p-type source region 614 are commonly connected by electrically conductive element 633. In the described embodiments, source regions 604 and 614 have the same sizes as respective source regions 602 and 612, and drain regions 603 and 613 have the same sizes as respective drain regions 601 and 611.

Gate electrodes 621 and 631 are coupled to receive the trim select signal TMS1[1]. Gate electrodes 622 and 632 are coupled to receive the inverse of trim select signal TMS1[1] from inverter 640. When trim select signal TMS1[1] has a logic low state, both the n-channel transistors and the p-channel transistors of transmission gate structures 650 and 660 are turned off. Under these conditions, the junction capacitance associated with source regions 602 and 612 is not coupled to differential clock signal line 581. Similarly, the junction capacitance associated with source regions 604 and 614 is not coupled to differential clock signal line 582. As a result, capacitive trim delay unit $TC_1$ does not introduce significant delay to clock signal $C_4$.

However, when trim select signal TMS1[1] has a logic high state, both the n-channel transistors and the p-channel transistors of transmission gate structures 650 and 660 are turned on. Under these conditions, the junction capacitance associated with source regions 602 and 612 is coupled to differential clock signal line 581. Similarly, the junction capacitance associated with source regions 604 and 614 is coupled to differential clock signal line 582. As a result of these capacitances being coupled to the clock signal lines 581–582, capacitive trim delay unit $TC_1$ introduces a significant delay to clock signal $C_4$. For example, each capacitive trim delay unit may introduce about 10 to 20 picoseconds of delay.

In accordance with one embodiment, capacitive trim delay units $TC_2$–$TC_7$ are substantially identical to trim delay unit $TC_1$, with, for example, only the source areas differing slightly. Capacitive trim delay units $TC_2$–$TC_7$ are coupled to receive trim select signals TMS1[2]–TMS1[7], respectively. Thus, activating one of the trim select signals activates the corresponding trim delay unit, thereby adding one trim delay to the associated clock signal. In an alternate embodiment, capacitive trim delay units $TC_1$–$TC_7$ can have differing sizes. For example, capacitive trim delay units $TC_2$–$TC_7$ can be sized to provide a binary capacitance weighting.

Advantageously, the present invention only requires a single delay path (e.g., clock lines 581–582) in each trim delay unit, thereby reducing the required number of logic gates in the design of the DCM.

In addition, because the buffers in the capacitive trim structures 411–415 are identical to the buffers in the tap delay structures 501–505, as process, voltage, and temperature vary, the buffers in the capacitive trim structures 411–415 and the buffers in the tap delay structures 501–505 will vary identically. As a result, the accuracy of the associated DCM is increased with respect to the prior art. In addition, trim delay elements $TC_1$–$TC_7$ provide for relatively small incremental delays, thereby increasing the accuracy of the DCM and lowering the jitter of the entire DCM.

Although the invention has been described in connection with several embodiments, it is understood that this invention is not limited to the embodiments disclosed, but is capable of various modifications, which would be apparent to one of ordinary skill in the art. For example, although capacitive trim delay elements $TC_1$–$TC_7$ have been described as including pass gate structures, it is understood that other capacitive elements (which can be selectively enabled and disabled) can be used in accordance with other embodiments of the present invention. Thus, although source diffusion regions 602 and 612 have been described as a source of capacitance, other layers can also be used to contribute to the desired capacitance. For example, it is possible to directly or indirectly couple polysilicon regions and/or metal layers to the source diffusion regions in order to provide the desired capacitance. Although a 7-bit trim select signal TMS1[7:1] has been described, it is understood that this trim select signal can have other numbers of bits in order to control the trim delay units 512–515. Moreover, although each trim delay unit has been described as having seven trim delay elements, it is understood that each trim delay unit can have other numbers of trim delay elements in other embodiments. Thus, the present invention is only intended to be limited by the following claims.

We claim:

1. A delay structure for a clock generator generating a plurality of clock outputs, said delay structure comprising:
   a plurality of delay elements coupled in series for receiving a clock signal, each delay element comprising:
      a tap delay adapted to introduce a first delay to the clock signal, thereby creating a first delayed clock signal;
      a first buffer adapted to introduce a second delay to the first delayed clock signal, thereby creating a second delayed clock signal;
      a set of one or more clock lines coupled to receive the second delayed clock signal from the first buffer; and
      a trim unit coupled to the set of one or more clock lines, wherein the trim unit couples a capacitance to the set of one or more clock lines in response to control signals, thereby introducing a third delay to the second delayed clock signal and creating a third delayed clock signal, wherein the plurality of delay elements generates a plurality of output signals, each output signal being dependent upon a delay introduced by a trim unit of the delay element generating the output signal;
   a phase detector coupled to compare the output signals of at least two delay elements of the plurality of delay elements, the phase detector providing an error signal representative of a difference between the phases of the output signals of the at least two delay elements;
   an output generator coupled to receive the third delayed clock signal from each trim unit of the plurality of delay elements and provide an output clock signal of the delay structure; and
   a control circuit adapted to provide the control signals to the trim units of the plurality of delay elements and to provide output control signals to the output generator, the control signals provided to the trim units being based upon the error signal representative of the difference between the phases of the output signals of the at least two delay elements received from the phase detector.

2. The delay structure of claim 1, wherein each delay element further comprises a second buffer coupled to the set of one or more clock lines and adapted to introduce a fourth delay to the third delayed clock signal.

3. The delay structure of claim 1, wherein each delay element further comprises a load buffer coupled to the set of one or more clock lines and adapted to provide a matching load to the first buffer.

4. The delay structure of claim 1, wherein the set of one or more clock lines includes a first clock line and a second clock line, and wherein the clock signal and the first delayed clock signal are differential clock signals.

5. The delay structure of claim 4, wherein each delay element comprises:
   a first plurality of selectable capacitive delay elements coupled to the first clock line; and
   a second plurality of selectable capacitive delay elements coupled to the second clock line.

6. The delay structure of claim 5, wherein each of the first plurality of selectable capacitive delay elements comprises a capacitive transmission gate structure for providing a source junction capacitance, and wherein one end of the capacitive transmission gate structure is floating.

7. The delay structure of claim 6, wherein the capacitive transmission gate structure comprises:
   an n-channel transistor having a drain coupled to the first clock line, and a source;
   a p-channel transistor having a drain coupled to the first clock line, and a source; and
   a conductive element coupling the source of the n-channel transistor and the source of the p-channel transistor;
   wherein the conductive element is floating.

8. The delay structure of claim 7, wherein the n-channel transistor includes a gate coupled to receive one of the control signals, and the p-channel transistor includes a gate coupled to receive the inverse of the one of the control signals.

9. The delay structure of claim 7, wherein layout areas of the sources of the n-channel transistor and p-channel transistor are larger than layout areas of the drains of the n-channel transistor and p-channel transistor.

10. The delay structure of claim 7, wherein layout areas of the sources of the n-channel transistor and p-channel transistor are substantially equal to or smaller than layout areas of the drains of the n-channel transistor and p-channel transistor.

11. The delay structure of claim 5, wherein each of the first plurality of selectable capacitive delay elements is substantially identical to each of the second plurality of selectable capacitive delay elements.

12. The delay structure of claim 1, wherein the trim unit comprises a plurality of selectable capacitive delay elements coupled to the set of one or more clock lines.

13. The delay structure of claim 12, wherein each of the selectable capacitive delay elements has a diffusion region width larger than a minimum process width used to fabricate the delay structure.

14. The delay structure of claim 4, wherein the first buffer is a differential buffer.

15. A method of operating a delay line comprising:
providing a plurality of delay elements coupled in series for receiving a clock signal;
introducing delays to clock signals, received from a delay element of the plurality of delay elements, with tap delays, thereby creating a first set of delayed clock signals;
introducing delays to the first set of delayed clock signals with buffers, thereby creating a second set of delayed clock signals, wherein each clock signal of the second set of delayed clock signals generated by the plurality of delay elements has a different delay;
providing the second set of delayed clock signals to a set of clock lines;
selectively enabling a set of capacitive trim elements tapped off the set of clock lines, wherein at least one capacitive trim element of the set of capacitive trim elements is tapped off each clock line of the set of clock lines thereby introducing delays to the second set of delayed clock signals, and creating a third set of delayed clock signals;
wherein selectively enabling the set of capacitive trim elements comprises enabling at least one capacitive transmission gate structure;
comparing phases of at least two delayed clock signals of the third set of delayed clock signals;
generating an error signal representative of a difference between the phases of the at least two delayed clock signals of the third set of delayed clock signals; and
adjusting trim control signals coupled to the plurality of delay elements so that the at least two delayed clock signals of the third set of delayed clock signals have a desired phase relationship.

16. The method of claim 15, further comprising introducing delays to the third set of delayed clock signals with buffers, thereby creating a set of delayed output clock signals.

17. The method of claim 15, further comprising coupling load buffers to the set of clock lines, wherein the load buffers match a load of the buffers.

18. The method of claim 15, wherein the clock signal and the first delayed clock signal are differential clock signals.

19. The method of claim 18, wherein the step of selectively enabling a set of capacitive trim elements tapped off the set of clock lines comprises:
selectively coupling a first plurality of selectable capacitive delay elements to a first clock line of the set of clock lines; and
selectively coupling a second plurality of selectable capacitive delay elements to a second clock line of the set of clock lines.

20. The method of claim 15, wherein the step of selectively enabling a set of capacitive trim elements tapped off the set of clock lines comprises:
coupling the drain region of an n-channel transistor and the drain region a p-channel transistor to a first clock line of the set of clock lines;
commonly coupling a source region of the n-channel transistor and a source region of the p-channel transistor;
applying a logic high voltage to a gate of the n-channel transistor; and
applying a logic low voltage to a gate of the p-channel transistors
wherein the commonly coupled source regions of the n-channel and p-channel transistors are floating; and
wherein the at least one capacitive transmission gate structure comprises the n-channel transistor and the p-channel transistor.

21. The method of claim 20, further comprising selecting the source region of the n-channel transistor and the source region of the p-channel transistor to have a greater layout area than the drain region of the n-channel transistor and the drain region of the p-channel transistor.

22. The method of claim 20, further comprising selecting the source region of the n-channel transistor and the source region of the p-channel transistor to have a layout area substantially equal to or less than the drain region of the n-channel transistor and the drain region of the p-channel transistor.

23. The method of claim 15, further comprising selectively disabling a set of capacitive trim elements tapped off the set of clock lines.

24. A delay structure for a clock generator generating a plurality of clock outputs, said delay structure comprising:
means for introducing delays to clock signals in a plurality of delay elements coupled in series, thereby creating a first plurality of delayed clock signals in the plurality of delay elements, wherein each clock signal of the first plurality of delayed clock signals has a different delay;
a set of clock lines adapted to receive the first plurality of delayed clock signals;
means for detecting a phase difference between the phases of output signals of at least two delay elements of the plurality of delay elements, wherein the means for detecting generates an error signal representative of the difference between the phases of the output signals of the at least two delay elements; and
means for selectively enabling sets of capacitive trim elements tapped off corresponding clock lines of the set of clock lines, the means for selectively enabling being responsive to the error signal representative of the difference between the phases of the output signals of the at least two delay elements, wherein at least one capacitive trim element of the set of capacitive trim elements is tapped off each clock line of the set of clock lines thereby introducing delays to the first plurality of delayed clock signals, and creating a second plurality of delayed clock signals;
wherein each capacitive trim element comprises a capacitive transmission gate structure for providing a source junction capacitance, one end of the capacitive transmission gate structure being floating.

25. The delay structure of claim 24, further comprising means for introducing delays to the second plurality of delayed clock signals, thereby creating a plurality of delayed output clock signals.

26. The delay structure of claim 24, further comprising a load buffer coupled to each clock line of the set of clock lines, wherein the load buffer matches a load of the means for introducing delays.

* * * * *